United States Patent
Letertre et al.

(10) Patent No.: US 7,067,393 B2
(45) Date of Patent: Jun. 27, 2006

(54) SUBSTRATE ASSEMBLY FOR STRESSED SYSTEMS

(75) Inventors: Fabrice Letertre, Grenoble (FR); Bruno Ghyselen, Seyssinet (FR); Olivier Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 153 days.

(21) Appl. No.: 10/755,006

(22) Filed: Jan. 8, 2004

(65) Prior Publication Data

US 2005/0006740 A1    Jan. 13, 2005

(30) Foreign Application Priority Data

Jul. 10, 2003 (FR) .................................. 03 08447

(51) Int. Cl.
*H01L 21/30* (2006.01)
*H01L 21/46* (2006.01)

(52) U.S. Cl. .............................. 438/455; 257/E21.567; 438/458

(58) Field of Classification Search ................ 438/107, 438/455, 457, 458, 459; 257/E23.002, E21.567, 257/E21.568

See application file for complete search history.

(56) References Cited

U.S. PATENT DOCUMENTS

| | | | |
|---|---|---|---|
| 5,089,431 A | 2/1992 | Slatter et al. ................. 437/39 |
| 5,126,820 A * | 6/1992 | Brown ........................ 257/420 |
| 5,506,753 A * | 4/1996 | Bertin et al. ................. 361/705 |
| 5,559,043 A | 9/1996 | Bruel ........................... 437/24 |
| 5,673,476 A | 10/1997 | Akaike et al. ................ 29/825 |
| 5,982,010 A * | 11/1999 | Namba et al. ............... 257/415 |
| 6,670,257 B1 | 12/2003 | Barlocchi et al. ........... 438/422 |
| 6,830,960 B1 * | 12/2004 | Alcoe et al. ................. 438/122 |
| 6,885,389 B1 * | 4/2005 | Inoue et al. .................. 346/45 |
| 2002/0160582 A1 | 10/2002 | Chen et al. .................. 438/455 |
| 2003/0017712 A1 | 1/2003 | Brendel ...................... 438/758 |

FOREIGN PATENT DOCUMENTS

| | | |
|---|---|---|
| EP | 0 425 037 A2 | 10/1990 |
| EP | 0 594 182 A2 | 10/1993 |
| EP | 0 706 219 A1 | 4/1996 |
| EP | 1 043 770 A1 | 10/2000 |
| FR | 2 837 981 | 10/2003 |
| WO | WO 03/083930 A1 | 10/2003 |

OTHER PUBLICATIONS

J. R. Bryden, XP-002275685, "Heat Sink", IBM Technical Disclosure Bulletin, vol. 11, No. 10 (Mar., 1969).

* cited by examiner

*Primary Examiner*—Carl Whitehead, Jr.
*Assistant Examiner*—Jennifer M. Dolan
(74) *Attorney, Agent, or Firm*—Winston & Strawn LLP

(57) ABSTRACT

A substrate-assembly having a mechanical stress absorption system. The assembly includes two substrates, one of which has a mechanical stress absorbing system, such as a plurality of motifs that absorb thermoelastic stresses, to prevent cracking or destruction of the substrates or separation of one substrate from the other.

26 Claims, 4 Drawing Sheets

SUBSTRATE ASSEMBLY FOR STRESSED SYSTEMS

FIELD OF INVENTION

The invention relates to a substrate assembly having a mechanical absorption stress system. In particular, the substrate assembly including a substrate having motifs formed therein.

BACKGROUND OF INVENTION

In the technological fields of micro-electronics or opto-electronics, substrates including those made from silicon or silicon carbide often have to be assembled together. This entails assembling substrates that often do not have the same or similar properties. In particular, the substrates that are assembled often do not have the same thermal properties. Due to this difference in thermal properties, problems often arise from assembling these substrates such as the development of tensile stress and/or compressive stress. This typically occurs when the substrate assembly is subjected to phases in which the temperature changes, sometimes over amplitudes of the order of 1000° C.

The effects of the stresses often cause damage to one or both of the substrates. In particular, at least one of the substrates may suffer from cracks under the effect of the stresses, or the substrate(s) may simply be destroyed.

Thus, a need exists for an assembly that is capable of withstanding stresses and the problems associated with these stresses, especially when the assembly comprises substrates having different thermal expansion coefficients.

SUMMARY OF INVENTION

The present invention provides a substrate assembly that is capable of absorbing stresses, especially thermoelastic stresses, that are associated with the problems of cracking and destruction of substrates that are subjected to high temperatures. The substrate assembly comprises first and second substrates each having a different thermal expansion coefficient. At least one of the first or second substrates has a mechanical stress absorption system is capable of absorbing thermoelastic stresses, and in particular, stresses generated at the assembly interface caused by exposure of the assembly to heating and cooling. The first substrate surface is bonded, preferably by molecular bonding, to the second substrate surface to form the assembly.

The mechanical stress absorption system preferably comprises a plurality of motifs provided in the surface of one of the substrates. Advantageously, the motifs have an elasticity or flexibility in a plane that is parallel to the substrate in which it is formed. Thus, when the two substrates have thermal expansion coefficients that differ at ambient temperature, the motifs absorb the stresses and prevent damage to the substrates and, in particular, prevent separation of the substrates at the bonding interface.

Advantageously, one of the substrates can be formed from silicon, quartz, sapphire, silicon carbide or glass, and the other can be formed from gallium arsenide, sapphire, silicon-germanium (SiGe), indium phosphide, aluminum nitride or silicon carbide. Further, at least one of the substrates can be in the form of one or more thin layers, each with a thickness preferably ranging from 0.1 micrometers (µm) to 2 µm.

In another embodiment, the substrate assembly includes a layer of silicon, a layer of oxide or insulator, and a substrate to form an SOI structure.

The invention also provides a method of assembling first and second substrates, wherein at least one of the substrates includes stress absorbing motifs. Thus, when the assembly undergoes a step in which the temperature changes, e.g., is raised and then dropped, the motifs are capable of absorbing mechanical stresses generated during the temperature rise or fall by the differences in thermal expansion of the materials.

In another aspect of the invention, a method is provided for producing a film or at least one thin layer formed from a first substrate and then transferred to a second substrate. In another aspect of this method, a plurality of layers is transferred to the second substrate. In this method a portion of one substrate is detached and transferred to another substrate.

DETAILED DESCRIPTION OF THE PREFERRED EMBODIMENTS

Figure 1A:
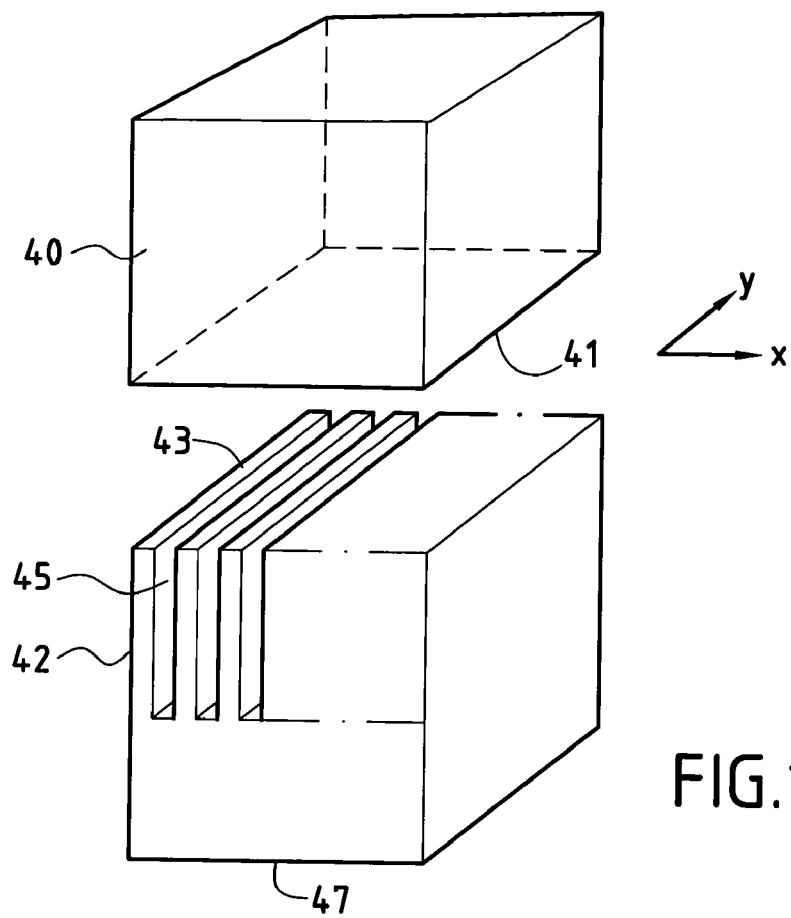
FIG. 1A illustrates a first substrate and a second substrate of the invention.

In one aspect of the invention is a substrate assembly for stressed systems as schematically shown in FIG. 1A. As shown, the substrate assembly comprises a first substrate and a second substrate. Preferably, the first and second substrates 40, 42 have different thermal expansion coefficients $c_0$ and $c_2$. For example and not limitation, one of the substrates may be a quartz substrate having an expansion coefficient $5 \times 10^{-7}$ $K^{-1}$ or a AsGa substrate having an expansion coefficient $6 \times 10^{-6}$ $K^{-1}$. The other substrate having the different thermal expansion coefficients may be a silicon substrate having an expansion coefficient $2.5 \times 10^{-6}$ $K^{-1}$, a germanium substrate having expansion coefficient $6 \times 10^{-6}$ $K^{-1}$, an alumina substrate ($Al_2O_3$,) having a thermal expansion coefficient $7 \times 10^{-6}$ $K^{-1}$ or a silicon carbide (SiC) substrate having a thermal expansion coefficient $4.5 \times 10^{-6}$ $K^{-1}$.

The difference in the thermal expansion coefficient between substrates 40 and 42 (or the relative difference $|c_0-c_2|/c_0$ or $|c_0-c_2|/c_2$) is preferably between about 10% to 30%, and more preferably between about 20% to 30%, measured at ambient temperature; 20° C. or 25° C.

Each of the first and second substrates 40, 42 may have a thickness between about 100 µm to 1 millimeter (mm). Alternatively, one of the substrates may be a thin layer of a plurality of thin layers having a thickness between about 0.1 µm to 2 µm.

At least one of the substrates includes a mechanical stress absorbing system, preferably in the form of an accommodation layer 45 formed in the substrate. The accommodation layer 45 provides a certain amount of elasticity in at least a plane xy parallel to its surface 43. The accommodation layer is preferably formed from motifs which can be obtained by etching, e.g., ion etching, at a surface of the substrate. For example, studs, trenches, saw cuts or any other geometrical motif can be formed in the substrate. Preferably, the motifs are periodical or ordered. Advantageously, the motifs are elastic and flexible in a plane that is parallel to the plane at the interface between the first and second substrates 40, 42. The resulting elasticity can be calculated by applying conventional beam theory. Thus, the motifs provide the assembly with a mechanical system of absorbing elements or mechanical stress absorbing means.

Figure 1B:
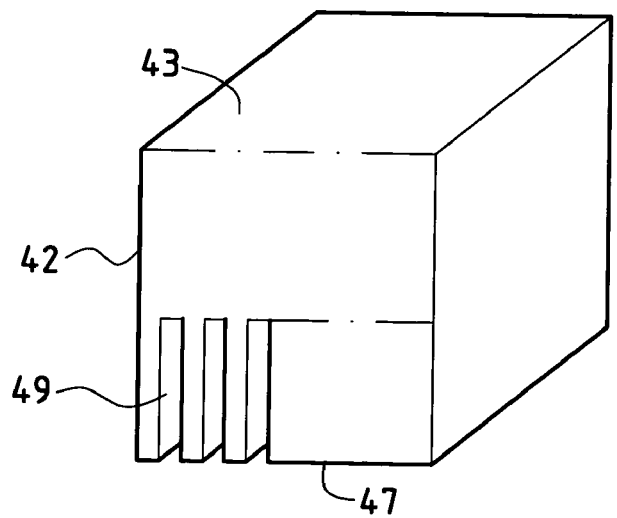
FIG. 1B illustrates a substrate-assembly of the invention.

As shown in FIG. 1B, the location of the accommodation layer 49 on the substrate may be at the rear surface 47 of the substrate 42. In other words, at the non-attaching surface of the substrate. This location advantageously avoids avoid any difficulties with affixing or adhering substrate 40 and the substrate 42.

Figure 1C:
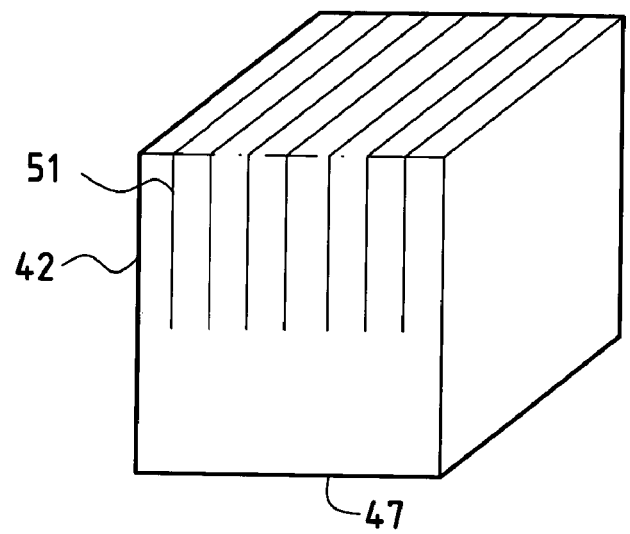
FIG. 1C illustrates a the substrate-assembly of the invention with motifs formed therein.

In another embodiment, as shown in FIG. 1C, cuts 51 resembling saw cuts are produced in the substrate 42 from one side of the substrate, thereby defining slices in the substrate and providing stress absorbing elements.

Preferably, the etched or hollowed motifs are repeated in a two-dimensional periodic pattern or in one dimension, as shown in FIGS. 1A–1C.

In another embodiment, the motifs include trenches that are formed in the substrate having a depth $p$ of 10 μm, a width $l$ of 1 μm and are spaced apart by a distance $e$ of 1 μm.

The first and second substrates 40, 42 are assembled together with a surface of the first substrate and a surface of the second substrate in a face to face orientation to form an assembly comprising first and second substrates. The first and second substrates may be assembled or affixed together by molecular bonding.

Figure 2:
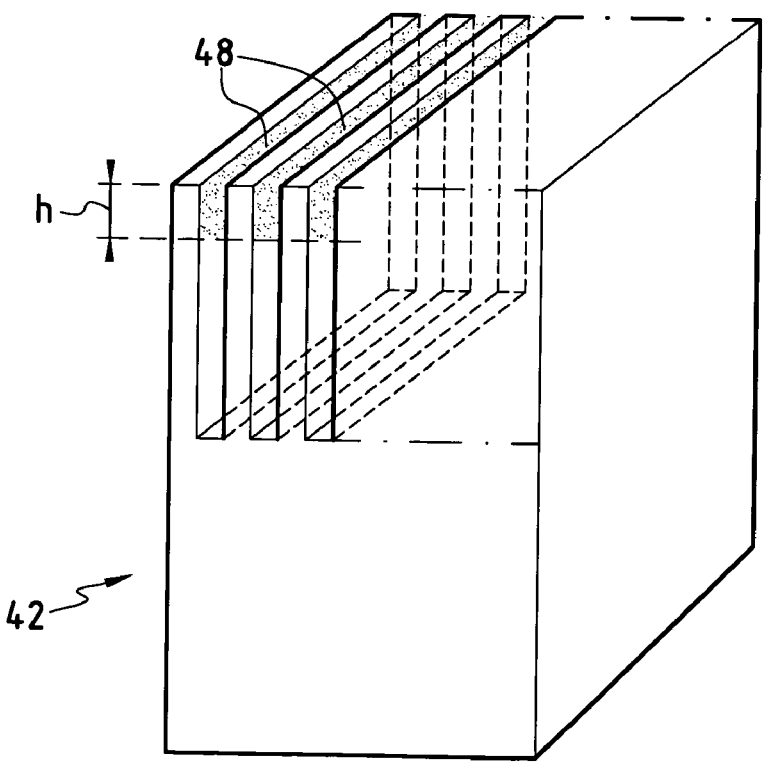
FIG. 2 illustrates filling a motif with species to a predetermined depth.

A substrate having motifs, for example trenches, substantially reduces the surface area of the surface in which the motifs are formed. For instance, the surface area may be reduced by about 50% depending on the amount of motifs formed. Thus, in the embodiments where it is desirable to have the motifs or trenches formed in bonding surface of the substrate, the distribution of the trenches or studs can be optimized to permit spontaneous bonding. To this end, the geometrical parameters of the motifs, for example the width and/or periodicity, may be adjusted. Additionally, in order to obtain an etched substrate while keeping the bonding surface planar, it is possible to partially or completely obturate the surface of the substrate prior to bonding. The stress absorbing effect is retained even if the entire depth of the trenches or motifs were to be obturated. For example and not limitation, if the surface is silicon, a step for smoothing the surface of substrate 42 may be carried out in a stream of hydrogen to partially or completely close the etching pits by migration of silicon atoms, as shown in FIG. 2, in which reference number 48 indicates filling the trench with silicon over a certain depth $h$.

In yet another example, a non-conforming deposit such as oxide for example may be used to obturate the surface of the motifs or trenches. The deposited oxide may be produced by a non-optimized filling method of the Shallow Trench Isolation or STI type, as is known in the art. Such a method has been described, for example in "A Highly Manufacturable Corner Rounding Solution for 0.18 μm Shallow Trench Isolation", C. P. Chang et al, IEDM 97-661.

Once the substrates have been assembled, a substrate assembly is provided which can absorb stresses such as thermoelastic stress, by the movement and/or deformation of the beams or studs or walls of the trenches or saw cuts, or other motifs.

During the assembly of the first and second substrates 40, 42 or during any subsequent treatment, temperature rise phases are often carried out. Under these temperature changes, any qualitative variations of the substrates or their surfaces due to their different thermal expansion coefficients is compensated for by the movement of the studs or motifs or trenches produced in the etched substrate 42. Thus, the substrate assembly for stressed systems is capable of absorbing those thermoelastic stresses due to the flexibility or elasticity provided by the motifs formed in the substrate. Any rise or fall in temperature will cause the two surfaces 40, 42 to expand differently and cause a movement of the motifs or trenches in a plane xy parallel to that of the substrates. This is particularly the case when the first and second substrates are assembled by providing a fracture in one of the substrates and transferring the fractured layer of that substrate to another substrate. Such method is known as the SMART-CUT (or substrate fracture) method.

Figure 3A:
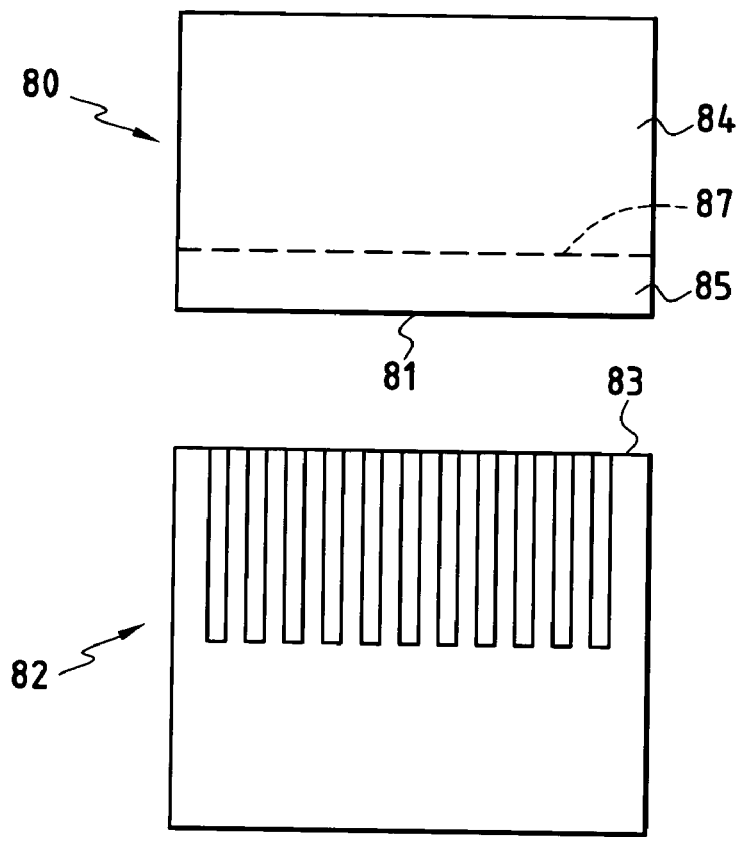
FIG. 3A illustrates a first substrate having implanted species and a second substrate having motifs.
Figure 3B:
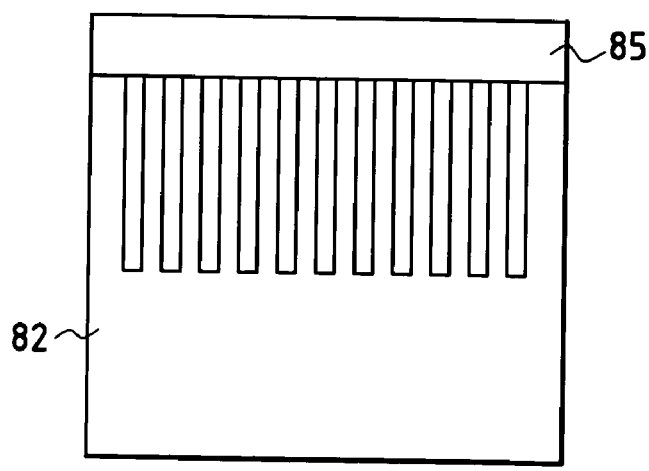
FIG. 3B illustrates an assembly formed from the substrates of FIG. 3A.

In the substrate fracture method, as schematically shown in FIGS. 3A and 3B, the first step (FIG. 3A) includes ion or atom implantation in a first substrate 80 to form a thin layer 87 of implanted species which extends substantially parallel to the surface 81 or the substrate 80. A layer or plane or zone of weakness or fracture is formed from the implanted species and also defines within the volume of the substrate 80a lower region 85 intended to constitute a thin film, and an upper region 84 constituting the bulk of the substrate 80. The species for implantation is generally hydrogen, but other species can also be used, as can hydrogen/helium co-implantation.

The two substrates 80 and 82 that are prepared are then assembled, face 83 against face 81, using a wafer bonding technique (assembling wafers by any technique that is known in the microelectronics art) or by adhesive contact (for example molecular bonding) or by bonding. Reference in this regard should be made to the work by Q. Y. Tong and U. Gösele, "Semiconductor Wafer Bonding", (Science and Technology), Wiley Interscience Publications.

A portion 84 of the substrate 80 is then detached by thermal or mechanical treatment to cause a fracture along the plane of weakness 87. One example of this technique has been described in the article by A. J. Auberton-Hervé et al entitled "Why can Smart Cut Change the Future of Microelectronics?" published in the International Journal of High Speed Electronics and Systems, Vol. 10, n. 1, 2000, p 131–146. The structure comprising the detached layer and the substrate is schematically depicted in FIG. 3B.

To strengthen the bonding or assembly interface between the substrate 82 (or its face 83) and the thin layer 85 (or the contact face 81) it may be desirable to raise the temperature to about 1000° C.

During temperature rise stages, the motifs etched into the substrate 82, in particular their flexibility or elasticity, compensates for or absorbs the stresses and differences in variations due to any differences between the thermal expansion coefficients of the two substrates 80, 82. Thus, the substrate assembly as depicted in 3B includes the mechanical stress absorption system.

The present invention also provides a film 85 including a set of superimposed films. In other words, this aspect of the invention concerns not only a substrate-substrate or monolayer-on-substrate system such as that described above, but any multilayer system involving depositing layers on a substrate.

A plane of weakness can be obtained by methods other than ion implantation. It is also possible to produce a layer of porous silicon as described by K. Sataguchi et al, in "ELTRAN® by Splitting Porous Si Layers", Proceedings of the 9$^{th}$ International Symposium on Silicon-on-Insulator Tech. and Device", 99-3, the Electrochemical Society, Seattle, p 117–121 (1999).

Figure 4A:
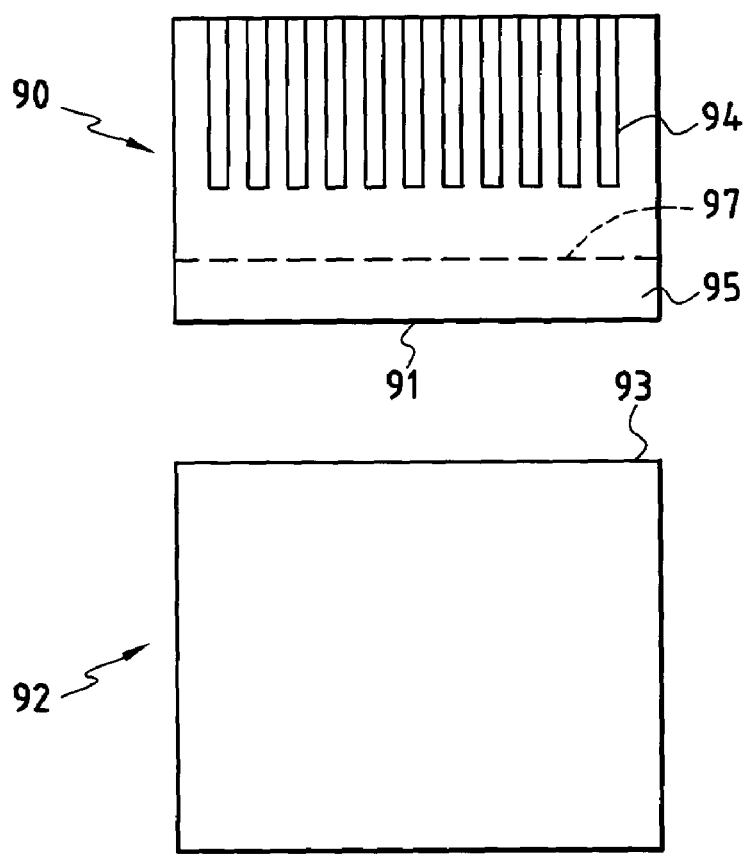
FIG. 4A illustrates a substrate having a plurality of motifs and implanted species.
Figure 4B:
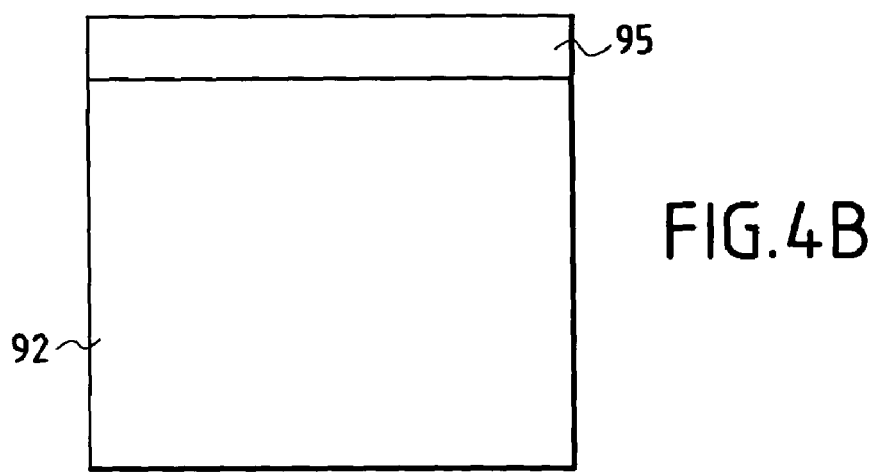
FIG. 4B illustrates a substrate-assembly formed from the substrates of FIG. 4A.

Other techniques can thin the substrates without employing ion implantation and without creating a plane of weakness: they are polishing or etching techniques. One variation of the method is shown in FIGS. 4A and 4B. An etched motif structure is produced in the substrate 90 intended to produce a thin layer 95 on the second substrate 92. The techniques for preparing the plane of weakness and assembling the two substrates are identical to those described above in connection with FIGS. 3A and 3B. The motifs do not appear in the final structure (FIG. 4B), in contrast to FIG. 3B. The plate or the substrate 90 can then be recycled, for example to transfer a new thin film to a further substrate. Thus, only one motif etching operations needs to be carried out for several transfer operations.

What is claimed is:

1. A method of fabricating a substrate-assembly having a mechanical stress absorption system comprising the steps of:
    providing each of first and second substrates with a bonding surface;
    providing a mechanical stress absorption system on the second substrate on a surface opposite the bonding surface;
    bonding the bonding surfaces of the first and second substrates to form an initial substrate assembly with the mechanical stress absorbing system being exposed; and
    removing the mechanical stress absorbing system from the second substrate to form a final substrate assembly;
    wherein the first substrate has a thermal expansion coefficient that is different than that of the second substrate and the mechanical stress absorption system absorbs thermoelastic stresses caused by exposure of the initial assembly to heating and cooling.

2. The method of claim 1, wherein the mechanical stress absorption system is formed as a two-dimensional, periodical pattern.

3. The method of claim 2, wherein the plurality of motifs are formed in the substrate by etching.

4. The method of claim 2, wherein the motifs are removed by thinning.

5. The method of claim 2, wherein the second substrate is implanted with species to form a zone of weakness, and further wherein a portion of the substrate is detached from the second substrate and transferred to the second substrate to form the final substrate assembly, with this transfer also removing the mechanical stress absorbing system.

6. The method of claim 2, wherein the second substrate is provided with a porous zone of weakness, and further wherein a portion of the substrate is detached from the second substrate and transferred to the second substrate to form the final substrate assembly, with this transfer also removing the mechanical stress absorbing system.

7. The method of claim 2, wherein the mechanical stress absorbing system is removed by polishing.

8. The method of claim 1, wherein the mechanical stress absorption system is provided with a plurality of motifs therein to absorb the thermoelastic stresses.

9. The method of claim 8, wherein the plurality of motifs are formed in the substrate by etching.

10. The method of claim 8, wherein the plurality of motifs formed in the substrate are spaced apart by a distance of about 1 µm.

11. The method of claim 1, wherein the first and second substrates are affixed to each other by wafer bonding, molecular contact or adhesive bonding.

12. The method of claim 1, wherein the first substrate is a layer detached from a third substrate.

13. The method of claim 12, wherein the third substrate is implanted with species to form a zone of weakness, and further wherein a portion of the substrate is detached from the third substrate and transferred to the second substrate to form a substrate assembly.

14. The method of claim 12, wherein the first substrate includes a plurality of layers.

15. The method of claim 12 wherein the bonding surface of the second substrate is smooth and does not contain motifs or any other stress absorption system.

16. The method of claim 1, wherein the mechanical stress absorbing system is removed by thinning.

17. The method of claim 1, wherein the second substrate is implanted with species to form a zone of weakness, and further wherein a portion of the substrate is detached from the second substrate and transferred to the second substrate to form the final substrate assembly, with this transfer also removing the mechanical stress absorbing system.

18. The method of claim 1, wherein the first thermal expansion coefficient and the second thermal expansion coefficient differ by about 10% to 30%.

19. The method of claim 1, wherein at least one of the first and second substrates have a thickness between about 100 µm to 1 mm.

20. The method of claim 1, wherein at least one of the first and second substrates has a thickness between about 0.1 µm to 2 µm.

21. The method of claim 1, wherein at least one of the first or second substrate comprises silicon, quartz, sapphire, silicon carbide, or glass.

22. The method of claim 21, wherein at least the other of the first or second substrates comprises gallium arsenide, sapphire, germanium, gallium nitride, silicon, silicon-germanium, indium phosphide, aluminum nitride, or silicon carbide.

23. The method of claim 1, wherein at least one of the first or second substrates comprises gallium arsenide, sapphire, germanium, gallium nitride, silicon, silicon-germaniun, indium phosphide, aluminum nitride, or silicon carbide.

24. The method of claim 1, wherein one of the substrates includes an oxide layer.

25. The method of claim 1, wherein the second substrate is provided with a porous zone of weakness, and further wherein a portion of the substrate is detached from the second substrate and transferred to the second substrate to form the final substrate assembly, with this transfer also removing the mechanical stress absorbing system.

26. The method of claim 1, wherein the mechanical stress absorbing system is removed by polishing.

* * * * *